(12) United States Patent
Lin et al.

(10) Patent No.: US 7,986,384 B2
(45) Date of Patent: Jul. 26, 2011

(54) LCD PANEL WITH LIGHT-SHIELDING STRUCTURE AND IMAGE DISPLAY SYSTEM USING SAME

(75) Inventors: Chieh-Wen Lin, Taichung (TW); Kuan-Chih Chen, Yilan (TW); Kuo-Chao Chen, Taoyuan (TW)

(73) Assignee: Chimei Innolux Corporation, Chu-Nan (TW)

( * ) Notice: Subject to any disclaimer, the term of this patent is extended or adjusted under 35 U.S.C. 154(b) by 270 days.

(21) Appl. No.: 12/357,238

(22) Filed: Jan. 21, 2009

(65) Prior Publication Data

US 2009/0185118 A1 Jul. 23, 2009

(30) Foreign Application Priority Data

Jan. 21, 2008 (TW) .............................. 97102265 A

(51) Int. Cl.
*G02F 1/1333* (2006.01)
(52) U.S. Cl. ........................................ 349/111; 349/110

(58) Field of Classification Search .................. 349/110, 349/111
See application file for complete search history.

(56) References Cited

U.S. PATENT DOCUMENTS 6,897,932 B2 * 5/2005 Murade et al. ................ 349/151

* cited by examiner

*Primary Examiner* — Richard H Kim
(74) *Attorney, Agent, or Firm* — Liu & Liu

(57) ABSTRACT

A display panel is used with an image display system. The display panel includes a light-transmissive substrate, a gate insulating layer, a gate conductor, a first light-shielding structure, a channel layer and a second light-shielding structure. The gate insulating layer is formed over the light-transmissive substrate. The gate conductor and the first light-shielding structure are made of the same material, formed over the gate insulating layer, and electrically isolated from each other. The first light-shielding structure has a hollow portion. The channel layer and the second light-shielding structure made of the same material and formed over the light-transmissive substrate but under the gate insulating layer. The second light-shielding structure is disposed under the hollow portion of the first light-shielding structure.

19 Claims, 4 Drawing Sheets

LCD PANEL WITH LIGHT-SHIELDING STRUCTURE AND IMAGE DISPLAY SYSTEM USING SAME

FIELD OF THE INVENTION

The present invention relates to a LCD panel, and more particularly to a LCD panel with a light-shielding structure. The present invention also relates to an image display system having such a LCD panel.

BACKGROUND OF THE INVENTION

Conventionally, a backlight serves as a light source of a liquid crystal display (LCD) panel for continuously illuminating light. By using a pixel electrode to control the light-shielding degree of the liquid crystal molecules, the LCD panel produces darkness or brightness variations so as to achieve display target. Since the pixel electrode fails to control all of the liquid crystal molecules, the brightness of the uncontrolled regions is unchangeable and thus the contrast ratio of the LCD panel is impaired.

As known, contrast ratios are important factors that influence the performance of LCD panels. For increasing contrast ratios, a conventional method uses a light-shielding structure to shield the light scattered from the regions uncontrolled by the pixel electrode. Generally, the light-shielding structure is made of opaque metallic material (e.g. aluminum). Since a common ground wire and a gate conductor of the LCD panel are also made of such opaque metallic material, the light-shielding structure is simultaneously defined when the common ground wire and the gate conductor are formed.

FIG. 1A is a schematic top view illustrating a conventional LCD panel. FIG. 1B is a schematic cross-sectional view of the LCD panel of FIG. 1A taken along the line A-A'. As shown in FIGS. 1A and 1B, the light-shielding structure 13 is arranged on a light-transmissive substrate 10. The light-shielding structure 13 is also arranged under a dielectric layer 19 and a data line 14 so as to enhance the light-shielding efficacy at the regions along the data line. Since no conductor is connected to the light-shielding structure 13, the light-shielding structure 13 is a floating structure. As previously described, the light-shielding structure 13, the common ground wire 11 and the gate conductor 12 are simultaneously defined by an opaque metallic layer in the same photomask processing procedure. For preventing the light-shielding structure 13 from being contacted with the common ground wire 11, the gate conductor 12 or other conductors, the light-shielding structure 13 is not extended to the data line 14 and a crossover region 15 between the common ground wire 11 and the gate conductor 12. That is, the crossover region 15 corresponds to a hollow portion of the light-shielding structure 13. Since the crossover region 15 is almost not shielded by the light-shielding structure 13, a light leak problem occurs in such a crossover region 15. The light leak problem usually results in a poor contrast ratio. In addition to the crossover region 15, the light leak problem occurs in the region around a contact hole conductor (not shown).

For solving the light leak problem, a silicon nitride (SiNx) film (not shown) is formed on the data line 14 to reduce amount of light leakage. Since an additional photomask processing procedure is required to form the silicon nitride (SiNx) film, the conventional method is not cost-effective.

SUMMARY OF THE INVENTION

The present invention provides a LCD panel with an improved light-shielding structure to prevent light leakage without the need of an additional photomask processing procedure.

In accordance with an aspect of the present invention, there is provided a display panel for use with an image display system. The display panel includes a light-transmissive substrate, a gate insulating layer, a gate conductor, a first light-shielding structure, a channel layer and a second light-shielding structure. The gate insulating layer is formed over the light-transmissive substrate. The gate conductor and the first light-shielding structure are made of the same material, formed over the gate insulating layer, and electrically isolated from each other. The first light-shielding structure has a hollow portion. The channel layer and the second light-shielding structure made of the same material and formed over the light-transmissive substrate but under the gate insulating layer. The second light-shielding structure is disposed under the hollow portion of the first light-shielding structure.

In accordance with another aspect of the present invention, there is provided a display panel for use with an image display system. The display panel includes a light-transmissive substrate, a contact hole conductor, a channel layer and a third light-shielding structure. The contact hole conductor is formed over the light-transmissive substrate. The channel layer and the third light-shielding structure are made of the same material, and formed over the light-transmissive substrate. The third light-shielding structure is disposed under the contact hole conductor. The cross-section area of the third light-shielding structure is greater than that of the contact hole conductor.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

As known, the process of fabricating such a Low temperature polysilicon thin film transistor (LTPS-TFT) has a step of forming a polysilicon layer on a glass substrate. In accordance with a key feature, the present invention uses the polysilicon layer as the light-shielding structure, so that no additional photomask processing procedure is required.

Figure 1A:
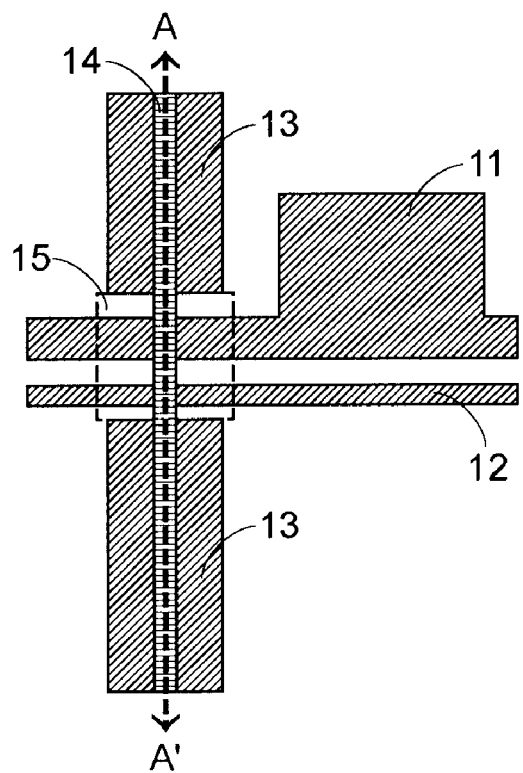
FIG. 1A is a schematic top view illustrating a conventional LCD panel.
Figure 1B:
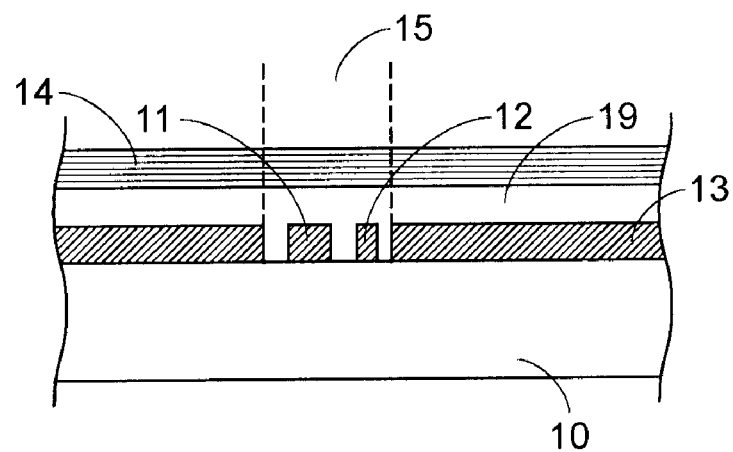
FIG. 1B is a schematic cross-sectional view of the LCD panel of FIG. 1A taken along the line A-A'.
Figure 2:
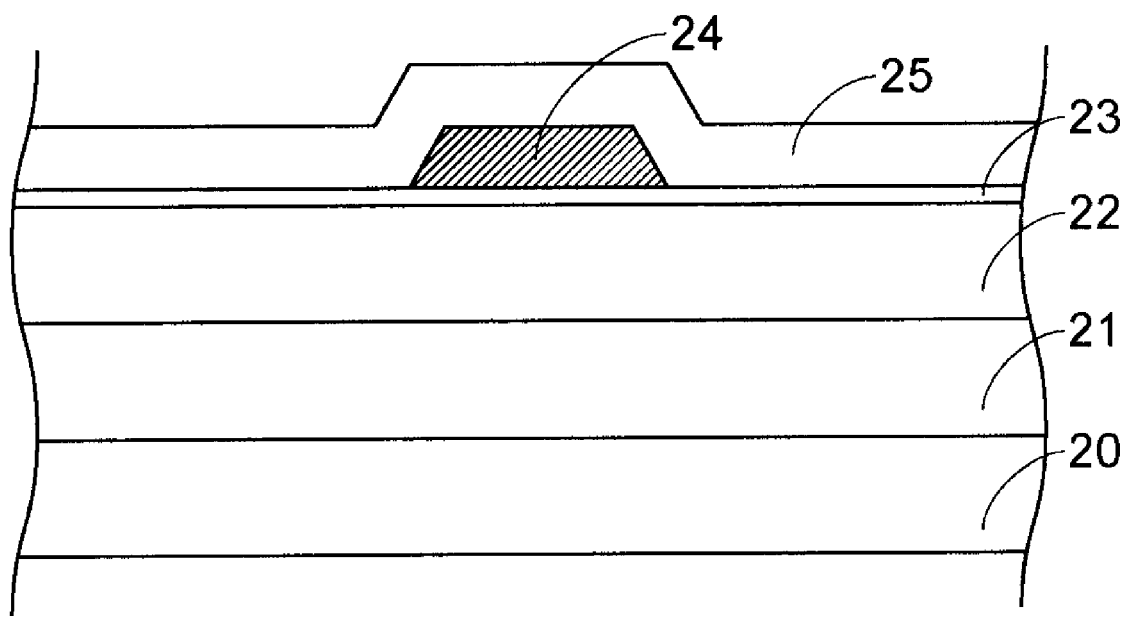
FIG. 2 is a partially schematic cross-sectional view of a TFT unit used in a LCD panel according to the present invention.

FIG. 2 is a partially schematic cross-sectional view of a TFT unit used in a LCD panel according to the present invention. As shown in FIG. 2, a buffer layer 21, a polysilicon channel layer 22, a gate insulating layer 23, a gate conductor 24 and an interlayer dielectric layer 25 are sequentially formed on a glass substrate 20. Since the gate insulating layer 23 is arranged between the polysilicon channel layer 22 and the gate conductor 24, the polysilicon channel layer 22 is isolated from the gate conductor 24 or other conductors. In other words, the polysilicon channel layer 22 can be extended over the crossover region 15 as shown in FIG. 1 so as to prevent the light leak problem. The present invention only needs a specific photomask to pattern the light-shielding structure on the polysilicon layer 22 but no additional photomask processing procedure is required.

Figure 3:
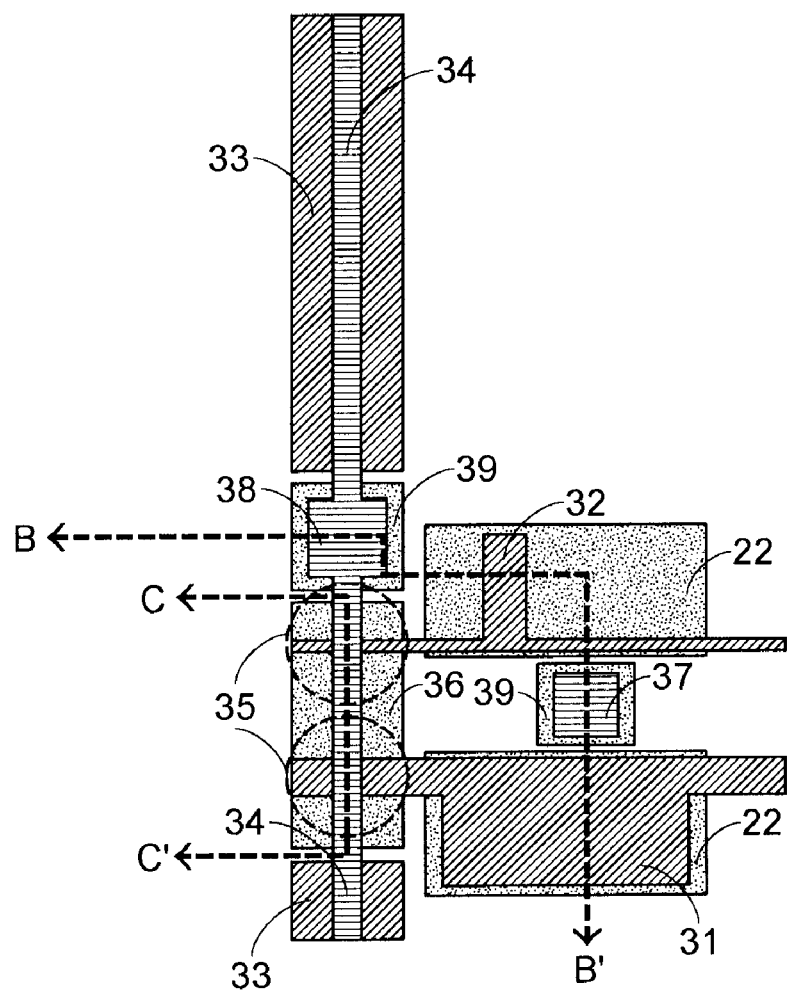
FIG. 3 is a schematic top view illustrating a LCD panel according to a preferred embodiment of the present invention.

The method of patterning the light-shielding structure on the polysilicon layer will be illustrated in more details with reference to FIG. 3. FIG. 3 is a schematic top view illustrating a LCD panel according to a preferred embodiment of the present invention. The LCD panel principally comprises a common ground wire 31, a gate conductor 32, a first light-shielding structure 33, a data line 34 and a second light-shielding structure 36. The common ground wire 31, the gate conductor 32, the first light-shielding structure 33 are simultaneously defined by an opaque metallic layer in the same photomask processing procedure. For preventing light leakage, the second light-shielding structure 36 is disposed under a crossover region 35 between the data line 34 and the common ground wire 31 and the gate conductor 32. The second light-shielding structure 36 and the polysilicon channel layer 22 are simultaneously defined by a polysilicon layer in the same photomask processing procedure. Since the second light-shielding structure 36 is also arranged between the buffer layer 21 and the gate insulating layer 23, the second light-shielding structure 36 will be electrically isolated from the data line 34, the common ground wire 31 and the gate conductor 32.

In some embodiment, two contact hole conductors 37, 38 and the data line 34 are simultaneously defined in the same photomask processing procedure. Likewise, the first light-shielding structure 33 cannot be arranged under the contact hole conductors 37, 38 in order to prevent electrical connection between the first light-shielding structure 33 and the contact hole conductors 37, 38. For preventing light leakage around the contact hole conductors 37, 38, a third light-shielding structure 39 is arranged under the contact hole conductors 37, 38. The cross-section area of the third light-shielding structure 39 is greater than the respect cross-section areas of the contact hole conductors 37 and 38. More especially, the third light-shielding structure 39, the second light-shielding structure 36 and the polysilicon channel layer 22 are simultaneously defined by the polysilicon layer in the same photomask processing procedure. As a consequence, only a specific photomask is needed to pattern the second light-shielding structure 36 and the third light-shielding structure 39 on the polysilicon layer 22 without the need of an additional photomask processing procedure.

Figure 4A:
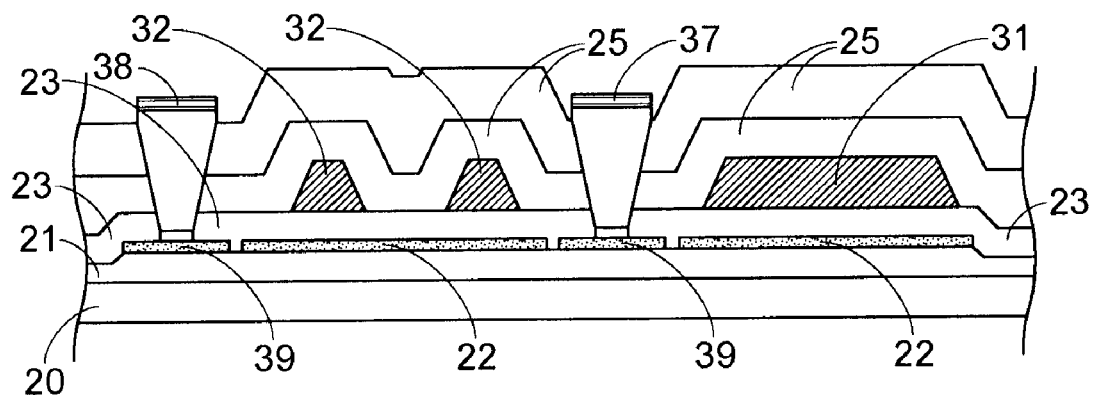
FIG. 4A is a schematic cross-sectional view of the LCD panel shown in FIG. 3 taken along the line B-B'.
Figure 4B:
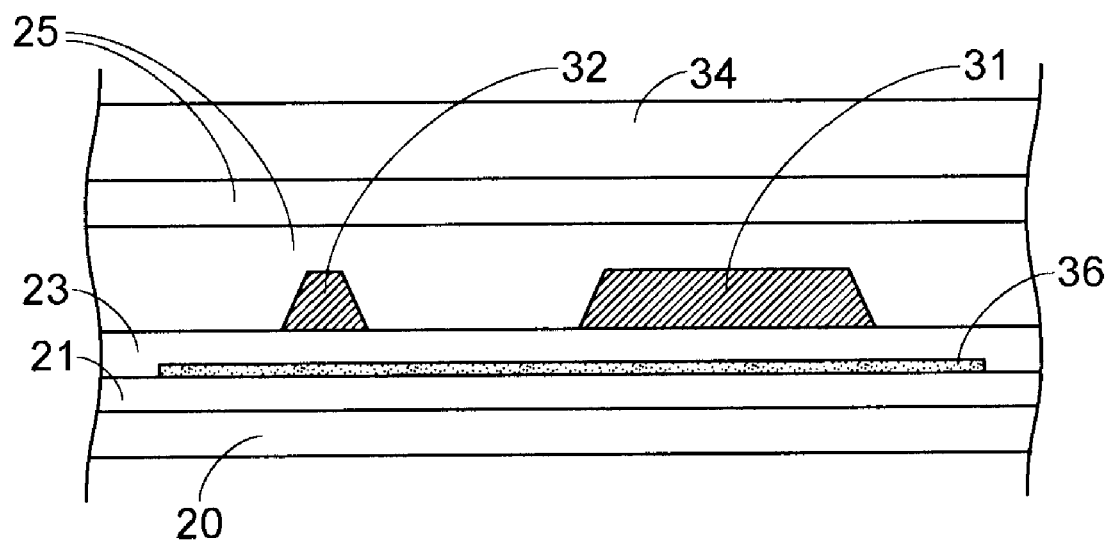
FIG. 4B is a schematic cross-sectional view of the LCD panel shown in FIG. 3 taken along the line C-C'.

FIG. 4A is a schematic cross-sectional view of the LCD panel shown in FIG. 3 taken along the line B-B'. FIG. 4B is a schematic cross-sectional view of the LCD panel shown in FIG. 3 taken along the line C-C'. In FIGS. 4A and 4B, the relative locations of the glass substrate 20, the buffer layer 21, the polysilicon channel layer 22, the gate insulating layer 23, the common ground wire 31, the gate conductor 32, the data line 34, the second light-shielding structure 36, the contact hole conductors 37, 38, the third light-shielding structure 39 and the interlayer dielectric layer 25 are shown. As shown in FIG. 4A, since the cross-section area of the third light-shielding structure 39 is greater than the respect cross-section areas of the contact hole conductors 37 and 38, the regions around the contact hole conductors 37 and 38 are shielded by the third light-shielding structure 39. As shown in FIG. 4B, the common ground wire 31, the gate conductor 32 and the data line 34 in the crossover region 35 are shielded by the second light-shielding structure 36.

From the above description, the second light-shielding structure and the third light-shielding structure of the present invention are capable of shielding the light leaking from the crossover region and the regions around the contact hole conductors. Since the second and third light-shielding structures are made of the same material as the channel layer and cooperatively defined with the channel layer, the photomask processing produced and the fabricating cost are reduced.

Figure 5:
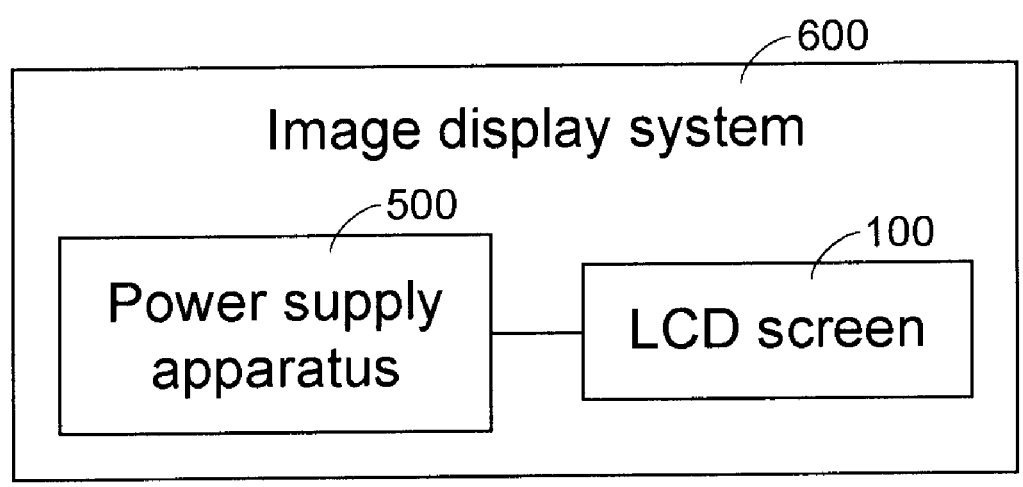
FIG. 5 is a schematic functional diagram illustrating an image display system according to the present invention.

FIG. 5 is a schematic functional diagram illustrating an image display system according to the present invention. The image display system 600 comprises a LCD screen 100 and a power supply apparatus 500. The LCD screen 100 has a LCD panel as shown in FIGS. 3 and 4. The power supply apparatus 500 is electrically connected to the LCD screen 100 for providing electric energy to the LCD screen 100. An example of the image display system 600 includes but is not limited to a mobile phone, a digital camera, a notebook computer, a desktop computer, a TV set, a global positioning system (GPS), an automotive display system, a flight display system, a digital photo frame, a portable DVD player, and the like.

The present invention is illustrated by referring to a LCD panel. Nevertheless, the present invention is applicable to other display panels such as organic light emitting diode (OLED) display panels.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A display panel, comprising:
a light-transmissive substrate;
a gate insulating layer formed over the light-transmissive substrate;
a gate conductor and a first light-shielding structure made of the same material, formed over the gate insulating layer, and electrically isolated from each other, wherein the first light-shielding structure has a hollow portion; and
a channel layer and a second light-shielding structure made of the same material and formed over the light-transmissive substrate but under the gate insulating layer, wherein the second light-shielding structure is disposed under the hollow portion of the first light-shielding structure.

2. The display panel according to claim 1 wherein the channel layer and the second light-shielding structure are made of polysilicon, and the channel layer and the second light-shielding structure are formed over the light-transmissive substrate but under the gate insulating layer by the same photomask processing procedure.

3. The display panel according to claim 1 wherein the gate conductor and the first light-shielding structure are made of opaque metallic material.

4. The display panel according to claim 1 wherein a crossover region between a data line and the gate conductor is included in the hollow portion, and the second light-shielding structure is disposed under the crossover region.

5. The display panel according to claim 1 wherein the light-transmissive substrate is a glass substrate, and the display panel further comprises a buffer layer over the glass substrate but under the channel layer and the second light-shielding structure.

6. The display panel according to claim 5 further comprising a common ground wire, which is formed over the glass substrate and made of the same material as the gate conductor and the first light-shielding structure, wherein a crossover region between a data line, the common ground wire and the gate conductor is included in the hollow portion, and the second light-shielding structure is disposed under the crossover region and between the buffer layer and the gate insulating layer.

7. The display panel according to claim 1 further comprising:
- a contact hole conductor formed over the light-transmissive substrate; and
- a third light-shielding structure made of the same material as the second light-shielding structure, and formed over the light-transmissive substrate but under the contact hole conductor, wherein the cross-section area of the third light-shielding structure is greater than that of the contact hole conductor.

8. The display panel according to claim 7 wherein the channel layer, the second light-shielding structure and the third light-shielding structure are made of polysilicon, and the second light-shielding structure and the third light-shielding structure are formed over the light-transmissive substrate but under the gate insulating layer by the same photomask processing procedure.

9. The image display system, comprising:
- the display panel according to claim 1; and
- a power supply apparatus electrically connected to the display panel for providing electric energy to the display panel.

10. A display panel, comprising:
- a light-transmissive substrate;
- a gate insulating layer formed over the light-transmissive substrate;
- a gate conductor and a first light-shielding structure made of the same material, formed over the gate insulating layer, and electrically isolated from each other, wherein the first light-shielding structure has a hollow portion;
- a second light-shielding structure made of the same material as the third light-shielding structure, and formed over the light-transmissive substrate but under the gate insulating layer, wherein the second light-shielding structure is disposed under the hollow portion of the first light-shielding structure;
- a contact hole conductor formed over the light-transmissive substrate; and
- a channel layer and a third light-shielding structure made of the same material, and formed over the light-transmissive substrate, wherein the third light-shielding structure is disposed under the contact hole conductor, and the cross-section area of the third light-shielding structure is greater than that of the contact hole conductor.

11. The display panel according to claim 10 wherein the channel layer and the third light-shielding structure are made of polysilicon, and the channel layer and the third light-shielding structure are formed over the light-transmissive substrate by the same photomask processing procedure.

12. The display panel according to claim 10 wherein the channel layer, the second light-shielding structure and the third light-shielding structure are made of polysilicon, and formed over the light-transmissive substrate but under the gate insulating layer by the same photomask processing procedure.

13. The display panel according to claim 12 wherein the gate conductor and the first light-shielding structure are made of opaque metallic material.

14. The display panel according to claim 10 wherein a crossover region between a data line and the gate conductor is included in the hollow portion, and the second light-shielding structure is disposed under the crossover region.

15. The display panel according to claim 10 wherein the light-transmissive substrate is a glass substrate, and the display panel further comprises a buffer layer over the glass substrate but under the channel layer and the second light-shielding structure.

16. The display panel according to claim 15 further comprising a common ground wire, which is formed over the glass substrate and made of the same material as the gate conductor and the first light-shielding structure, wherein a crossover region between a data line, the common ground wire and the gate conductor is included in the hollow portion, and the second light-shielding structure is disposed under the crossover region and between the buffer layer and the gate insulating layer.

17. The image display system according to claim 9, wherein the image display system is a mobile phone, a digital camera, a notebook computer, a desktop computer, a TV set, a global positioning system, an automotive display system, a flight display system, a digital photo frame or a portable DVD player; and the display panel is a LCD panel or an OLED panel.

18. The image display system, comprising:
- the display panel according to claim 10; and
- a power supply apparatus electrically connected to the display panel for providing electric energy to the display panel.

19. The image display system according to claim 18, wherein the image display system is a mobile phone, a digital camera, a notebook computer, a desktop computer, a TV set, a global positioning system, an automotive display system, a flight display system, a digital photo frame or a portable DVD player; and the display panel is a LCD panel or an OLED panel.

* * * * *